United States Patent [19]

Itoh

[11] Patent Number: 6,044,016

[45] Date of Patent: Mar. 28, 2000

[54] NAND-TYPE SEMICONDUCTOR MEMORY DEVICE

[75] Inventor: Hideki Itoh, Nagasaki, Japan

[73] Assignee: Sony Corporation, Japan

[21] Appl. No.: 09/071,770

[22] Filed: May 4, 1998

[30] Foreign Application Priority Data

May 15, 1997 [JP] Japan ..................................... 9-125781

[51] Int. Cl.[7] .......................... G11C 16/04; H01L 29/788
[52] U.S. Cl. ...................................... 365/185.17; 257/316
[58] Field of Search ........................ 365/185.17, 185.11; 257/315, 316, 390, 319

[56] References Cited

U.S. PATENT DOCUMENTS

| | | | |
|---|---|---|---|
| 5,031,011 | 7/1991 | Aritome | .................................. 257/319 |
| 5,568,421 | 10/1996 | Aritome | ............................. 365/185.17 |
| 5,591,999 | 1/1997 | Momodomi et al. | .................... 257/316 |
| 5,680,347 | 10/1997 | Takeuchi et al. | .................. 365/185.17 |

*Primary Examiner*—Son Mai

*Attorney, Agent, or Firm*—Rader, Fishman & Grauer; Ronald P. Kananen

[57] ABSTRACT

In a NAND-type memory device, an area required to form a memory array thereof can be reduced. In one NAND-type memory device 30, a bit line 32A and another bit line 32B are extended in parallel to each other. These bit lines 32A and 32B are connected via bit contacts 36A and 36B to a first memory cell 34A, and a second memory cell located adjacent to the first memory cell 34A along a word line direction. A bit contact 36A and another bit contact 36B are arranged along a diagonal line direction while intersecting the respective first and second memory cells, respectively. The bit contact 36A is employed so as to connect a drain region of the first memory cell 34A to the bit line 32A. The bit contact 36B is employed in order to connect a drain region of the second memory cell to the bit line 32B. On the opposite side of the bit contact 36A by sandwiching the first memory cell 34A, a source contact 38A for connecting a source diffusion layer to a source line is provided adjacent to the bit contact 36B. A source line 40 is formed between a control gate 42 and the bit line 32, and then is connected via another source contact 38B to a diffusion layer 44.

4 Claims, 5 Drawing Sheets

NAND-TYPE SEMICONDUCTOR MEMORY DEVICE

BACKGROUND OF THE INVENTION

1. Field of the Invention

The present invention generally relates to a NAND-type memory device capable of reducing dimensions of memory cells. More specifically, the present invention is directed to plane arrangements and layer structures of memory cells, bit lines, and bit contacts employed in a memory cell array of a compact NAND-type memory device.

It should be understood in this specification that a NAND-type semiconductor memory device implies such a memory device constructed by NAND-type memory cells in which a plurality of memory transistors are series-connected to each other and are arranged in a matrix form, and each NAND-type memory cell is connected via bit contacts to bit lines connected in an array shape.

2. Description of the Related Art

Referring now to FIG. 1A and FIG. 1B, a description will be made of a plane arrangement and a layer structure of memory cells, bit lines, and bit contacts provided in a memory cell of a conventional NAND-type memory device. FIG. 1A is a plan view for showing a plane arrangement of a conventional NAND-type flash memory device 10. FIG. 1B is a sectional view for indicating a layer structure of this NAND-type flash memory device, taken along a line I—I of FIG. 1A.

In a conventional NAND-type memory device, for instance, in the NAND-type flash memory device 10, as indicated in FIG. 1A, bit lines 12A and 12B connected to the respective memory cells are wired in the array form. Both a bit contact 16A and another bit contact 16B are arranged on one side (namely, right side of memory group in FIG. 1A) of a memory cell group. The bit contact 16A connects a drain region of a memory cell 14A to the bit line 12A. The bit contact 16B connects a drain region of another memory cell (not shown) located adjacent to this memory cell 14A to the bit line 12B. Similarly, bit contacts of all of the bit lines are sequentially arranged on one side of the memory cell group.

Also, as indicated in FIG. 1A and FIG. 1B, a source line 18 is formed by continuing a source region diffusion layer 18. A gate within a memory cell is constituted by a floating gate 20 and a control gate 22 provided via an insulating film with the floating gate 20. Reference numeral 26 shown in FIG. 1A indicates activated regions of the respective memory cells. Reference numeral 24 of FIG. 1B denotes an insulating film.

As indicated in FIG. 1A, a pitch "D" of the bit lines 12 will depend upon an allowable minimum interval (represented as "A" in FIG. 1A) defined when the bit lines 12 are formed, a joint margin (indicated as "B" in FIG. 1A) defined when the bit line 12 is connected to the bit contact 16, and an allowable minimum processing dimension (denoted as "C" in FIG. 1A) of the bit control. This pitch "D" is expressed by:

$$D = A + 2 \times B + C.$$

In other words, in the conventional bit line plane arrangement, the necessary dimension of the memory cell array along the word line (control gate) direction, namely the necessary dimension along a direction perpendicular to the bit line is necessarily restricted, or constrained by the pitch dimension of the bit line, i.e., $D = A + 2 \times B + C$. Even when the width dimension of the memory cell may be reduced, the dimension of the memory cell array along the word line direction could not be reduced unless the pitch dimension of the bit lines could be decreased. As a consequence, a recognition could be made of such a fact that the pitch dimension of the pitch lines should be reduced in order to reduce the memory array. However, the respective dimensions of the above-described factors "A", "B", and "C" for defining the pitch dimension are nowadays set to the minimum dimensions thereof. Accordingly, there are various technical difficulties to further reduce these minimum dimensions.

On the other hand, while semiconductor devices are rapidly made in very fine dimensions and higher integration, a similar demand is made of NAND-type memory devices to be manufactured in very fine dimensions and high integration.

Therefore, an object of the present invention is to provide a NAND-type memory device having a small-sized memory array by arranging bit contacts in such a manner that a pitch dimension can be shortened.

SUMMARY OF THE INVENTION

The above objects and others are accomplished by a NAND-type memory device according to the present invention (simply referred to as a "first invention" hereinafter) wherein NAND-type memory cells in which a plurality of memory transistors are series-connected are arranged in a matrix form, and the NAND-type memory device is comprised of a memory cell array in which the respective NAND-type memory cells are connected via bit contacts to bit lines wired in an array form; and a plane arrangement of the memory cells, the bit lines, and the bit contacts within the memory cell array wherein;

a bit contact of a bit line of a first memory cell, and also a bit contact of a bit line of a second memory cell located adjacent to the first memory cell along a word line direction are mutually arranged along a diagonal direction with sandwiching both the first and second memory cells.

With employment of the above-described arrangement, in the NAND-type memory device of the first invention, since the bit contacts of the bit lines for the respective memory cells are mutually arranged in a stagger form with sandwiching of the memory cells, the pitch dimension of the bit lines of the memory device according to the present invention can be shortened, as compared with the pitch dimension of the conventional arrangement. As a result, since the memory cell is reduced in conjunction with the pitch dimension, the area required to form the memory cell array can be reduced. It should be noted that the first memory cell implies an arbitrary memory cell within the memory cell array, and the second memory cell implies another memory cell located adjacent to the first memory cell along the word line direction.

In accordance with a preferred embodiment mode of the present invention, in the NAND-type memory device, a source line connected to a source region of each of the first and second memory cells owns a layer structure formed between a control gate and the bit line. As a result, it is possible to avoid physical and also electrical interference between the source line and the bit contact.

Also, another NAND-type memory device according to the present invention (simply referred to as a "second invention" hereinafter) is featured by that in a NAND-type memory device wherein NAND-type memory cells in which a plurality of memory transistors are series-connected are arranged in a matrix form, and the NAND-type memory device is comprised of a memory cell array in which the respective NAND-type memory cells are connected via bit contacts to bit lines wired in an array form;

a plane arrangement of the memory cells, the bit lines, and the bit contacts within the memory cell array;

a bit contact of a bit line of a first memory cell, and also a bit contact of a bit line of a second memory cell located adjacent to the first memory cell along a word line direction are mutually arranged along a diagonal direction with sandwiching both the first and second memory cells, and a switching transistor is provided between the bit contact of the bit line of the first memory cell and the source region of the second memory cell, and selectively switches the bit line of the first memory cell in such a manner that the bit line of the first memory cell is electrically interrupted form the first memory cell and then functions as a source line of the second memory cell.

With employment of the above-explained arrangement, in accordance with the NAND-type memory device of the second invention, since the bit line may have the function of the source line, the dedicated wiring line of the source line is not required. Accordingly, there is another effect that the integration of this memory device along the word line direction can be further increased in addition to the above-described effect of the first invention. Therefore, the memory cell arrays can be furthermore reduced.

In another preferred embodiment mode of the present invention, a depletion mode MOSFET is provided on a connection side of a source region of the switching transistor.

It should be understood that both the first invention and the second invention may be applied to any sorts and any types of such NAND-type memory devices. That is, this memory device corresponds to a NAND-type memory device wherein NANA-type memory cells in which a plurality of memory transistors are series-connected are arranged in a matrix form, and the NAND-type memory device is comprised of a memory cell array in which the respective NAND-type memory cells are connected via bit contacts to bit lines wired in an array form. For instance, the first and second inventions may be applied to a NAND-type ROM, a NAND-type floating mode memory device having an FAMOS structure, a NAND-type nonvolatile memory device having an MNOS structure, an ultraviolet erasable type EPROM, and a batch-erasable NAND-type EEPROM (namely, NANA-type flash memory device) capable of electrically erasing data in a batch mode.

BRIEF DESCRIPTION OF THE DRAWINGS

For a better understanding of the present invention, reference is made of a detailed description to be read in conjunction with the accompanying drawings, in which.

DETAILED DESCRIPTION OF THE PREFERRED EMBODIMENTS

Referring now to drawings, various preferred embodiment modes according to the present invention will be described in detail.

EMBODIMENT 1

Figure 1A:
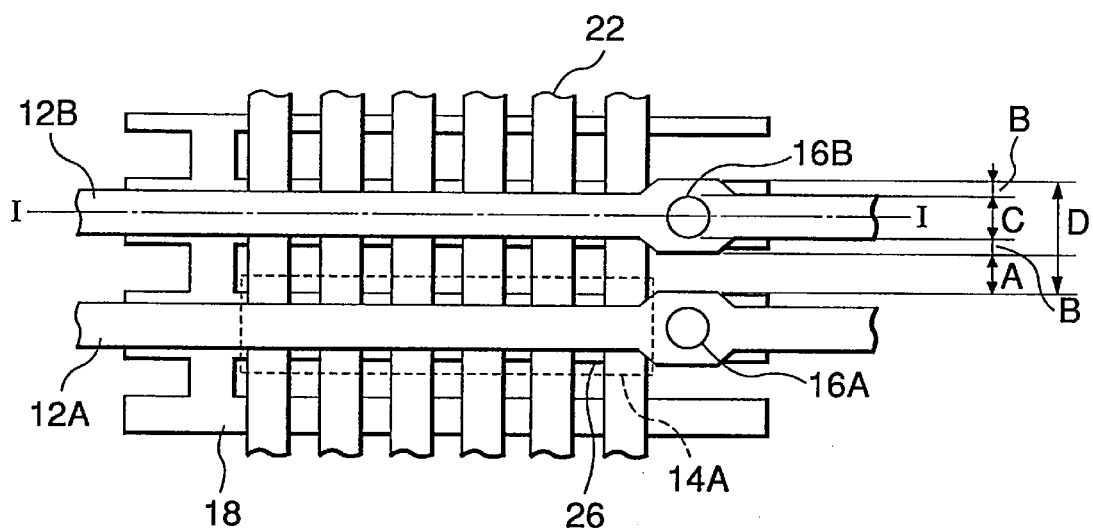
FIG. 1A is a plan view for showing the plane arrangement of the conventional NAND-type flash memory device.
Figure 1B:
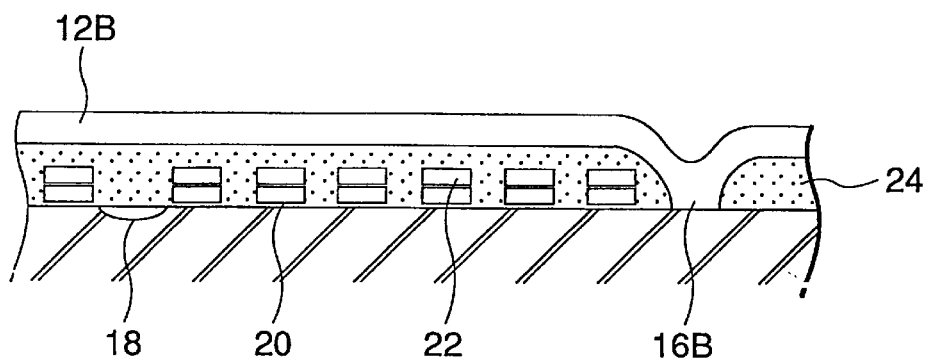
FIG. 1B is a sectional view for indicating the layer structure of the conventional NAND-type flash memory device, taken along a line I—I of FIG. 1A.
Figure 2A:
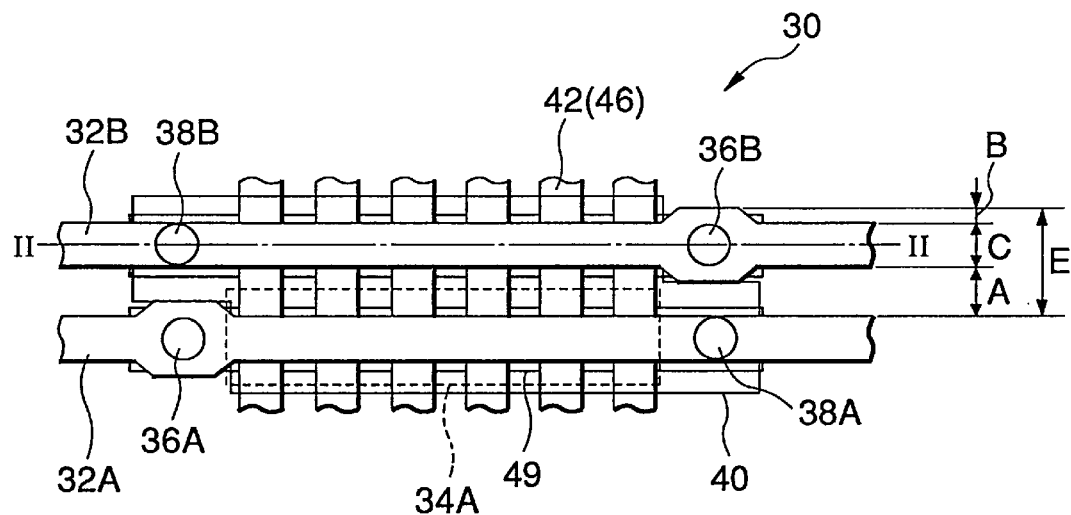
FIG. 2A is a plan view for representing a plane arrangement of a NAND-type flash memory device according to a first embodiment 1 of the present invention.
Figure 2B:
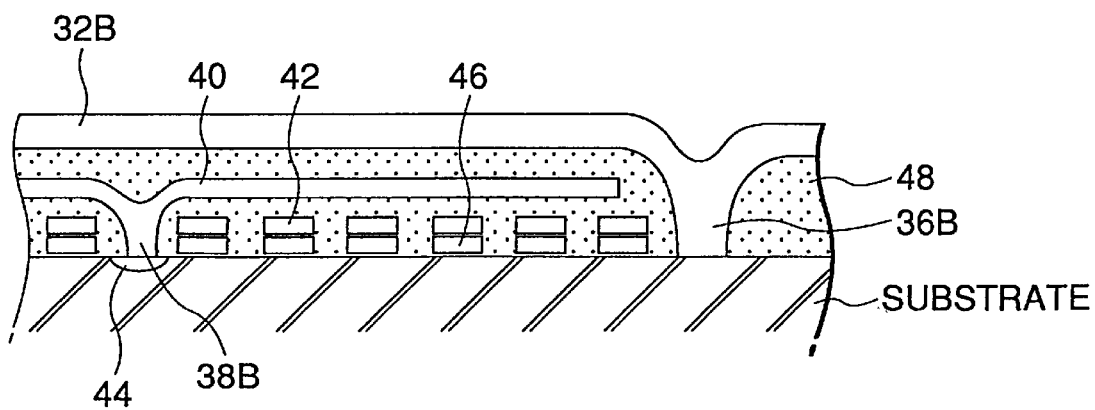
FIG. 2B is a sectional view for indicating a layer structure of the NAND-type flash memory device, taken along a line II—II of FIG. 2A.

A first embodiment 1 is accomplished by applying the NAND-type memory device according to the present invention to a NAND-type flash memory device 30. That is, FIG. 2A is a plan view for indicating a plane arrangement of bit lines and bit contacts provided in a memory cell array of the NAND-type flash memory device 30 according to this embodiment 1. FIG. 2B is a sectional view for indicating a layer structure of the NAND-type flash memory device 30, taken along a line II—II of FIG. 2A.

As indicated in FIG. 2A, in the NAND-type flash memory 30 according to this embodiment 1, a bit line 32A and another bit line 32B are extended in parallel to each other, as viewed in this drawing. These bit lines 32A and 32B are connected via bit contacts 36A and 36B to a first memory cell 34A, and a second memory cell (not shown) located adjacent to the first memory cell 34A along a word line direction.

A bit contact 36A and another bit contact 36B are arranged along a diagonal line direction while intersecting the respective first and second memory cells, respectively. The bit contact 36A is employed so as to connect a drain region of the first memory cell 34A to the bit line 32A. The bit contact 36B is employed in order to connect a drain region of the second memory cell (not shown) to the bit line 32B.

In this NAND-type flash memory device 30, bit contacts of bit lines other than the bit lines 32A and 32B are arranged in a similar manner, and the respective bit contacts are mutually arranged in a staggered form by sandwiching the memory cells.

On the opposite side of the bit contact 36A by sandwiching the first memory cell 34A, a source contact 38A (actually not viewed) for connecting a source diffusion layer to a source line is provided adjacent to the bit contact 36B. As indicated in FIG. 2B, a source line 40 is formed between a control gate 42 and the bit line 32, and then is connected via another source contact 38B to a diffusion layer 44. In FIG. 2A and FIG. 2B, reference numeral 46 shows a floating gate, reference numeral 48 indicates an insulating film, and reference numeral 49 denotes an activated region of the first memory cell 34.

As described above, in accordance with this embodiment 1, since the bit line 32, the memory cell 34, the bit contact 36, and the source contact 38 are arranged on the plane, the pitch dimension "E" of the bit line 32 (namely, bit line 32A and bit line 32B) is given as follows: E=A+B+C, as shown in FIG. 2A. Accordingly, this pitch dimension E is shortened only by the dimension B, as compared with the pitch dimension "D" of the conventional NAND-type flash memory device. As a result, the widths of the respective memory cells along the word line direction are successively shortened by the dimension B, so that the dimensions of the memory cell arrays along the word line direction, employed in the NAND-type flash memory device 30, can be greatly shortened.

EMBODIMENT 2

Figure 3:
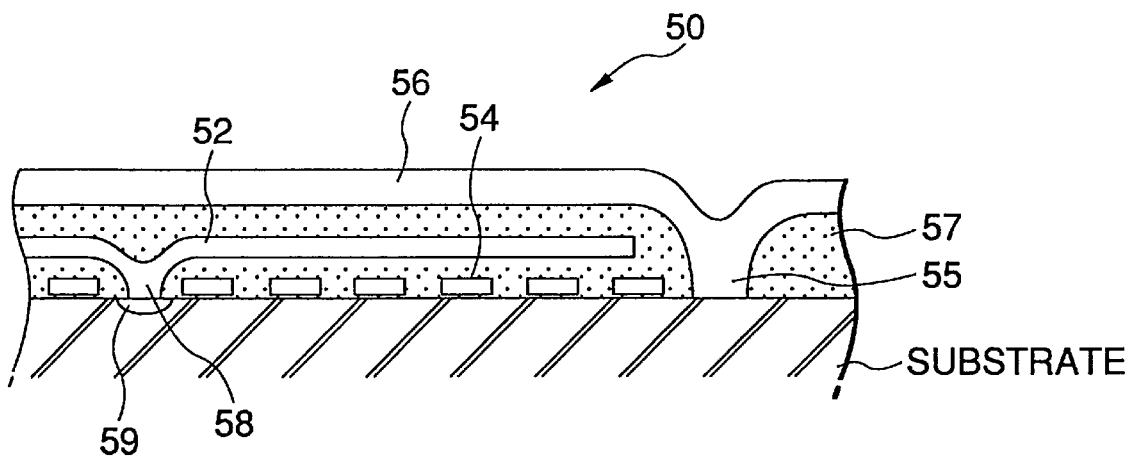
FIG. 3 is a sectional view for showing a layer structure of a NAND-type ROM according to a second embodiment 2 of the present invention.

A second embodiment is accompanied by applying the NAND-type memory device of the invention to a NAND-type ROM (read-only memory) 50. FIG. 3 is a sectional view for indicating a layer structure of the NAND-type ROM 50 according to this embodiment 2.

In the NAND-type ROM 50 of this embodiment 2, bit lines, memory cells, bit contacts, and source contacts are arranged in a similar plane arrangement to that of the NAND-type flash memory 30 of the first embodiment.

A source line 52 is formed between a control gate 54 and a bit line 56, and is connected via a source contact 58 to a diffusion layer 59, as shown in FIG. 3. In FIG. 3, reference numeral 55 indicates a bit contact, and reference numeral 57 shows an insulating film.

The NAND-type ROM 50 with the above-described arrangement owns a similar effect to that of the first embodiment.

EMBODIMENT 3

Figure 4:
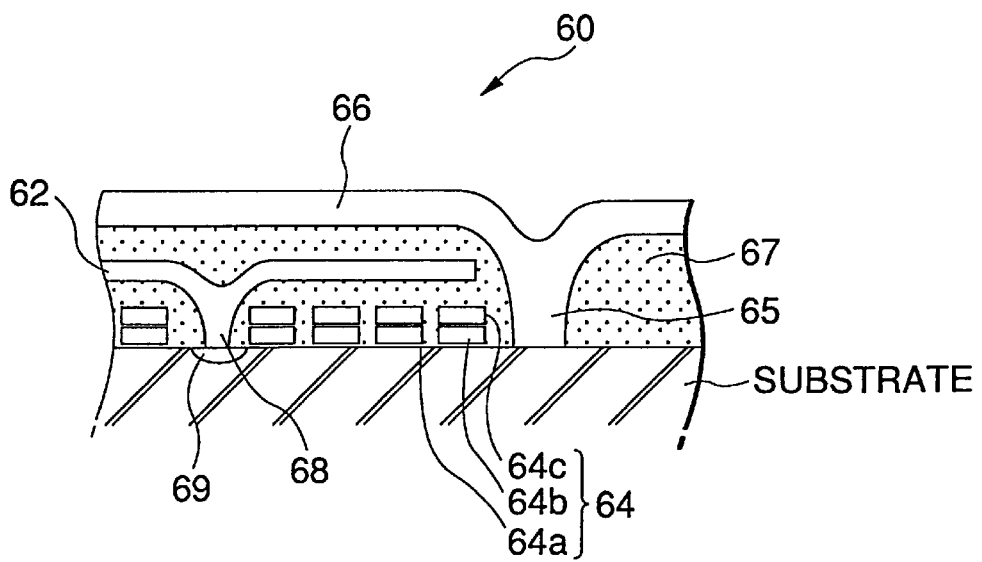
FIG. 4 is a sectional view for showing a layer structure of a NAND-type MNOS memory device according to a third embodiment of the present invention.

A third embodiment is accompanied by applying the NAND-type memory device of the first invention to a NAND-type MNOS memory device 60. FIG. 4 is a sectional view for indicating a layer structure of the NAND-type MNOS memory device 60 according to this embodiment.

In the NAND-type MNOS memory device 60 of this embodiment 3, bit lines, memory cells, bit contacts, and source contacts are arranged in a similar plane arrangement to that of the NAND-type flash memory 30 of the first embodiment.

A source line 62 is formed between a control gate 64 and a bit line 66, and is connected via a source contact 68 to a diffusion layer 69, as indicated in FIG. 4. In FIG. 4, reference numeral 65 indicates a bit contact, and reference numeral 67 shows an insulating film. It should be noted that the control gate 64 is such as electrode having a stacked layer structure manufactured by that a nitride film 64b having a thickness of 30 to 80 nm is formed on a thin gate insulating film 64a having at thickness of 2 to 5 nm, on which a polysilicon layer 64c is formed.

The NAND-type MNOS type memory device 60 with the above-described arrangement owns a similar effect to that of the second embodiment.

EMBODIMENT 4

Figure 5A:
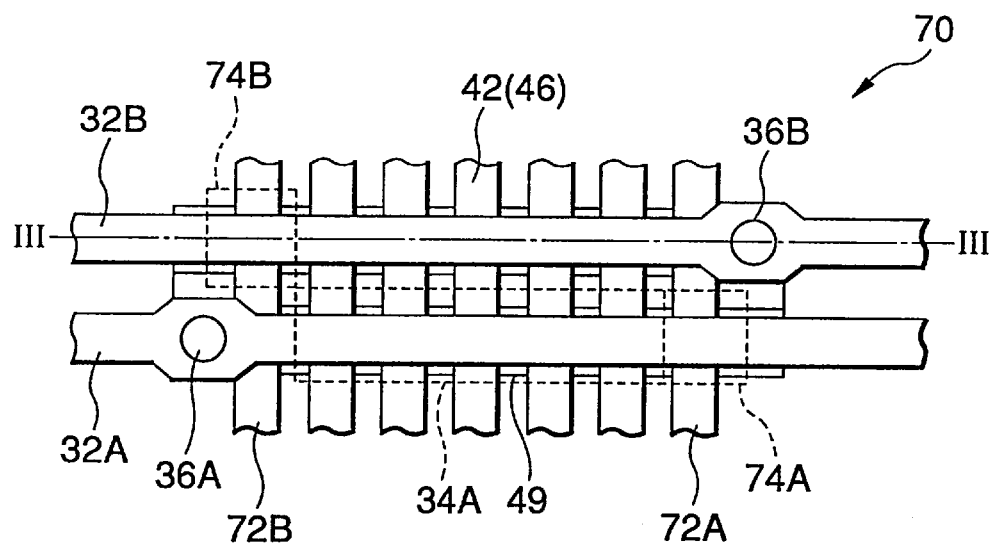
FIG. 5A is a plan view for representing a plane arrangement of a NAND-type flash memory device according to a fourth embodiment 4 of the present invention.
Figure 5B:
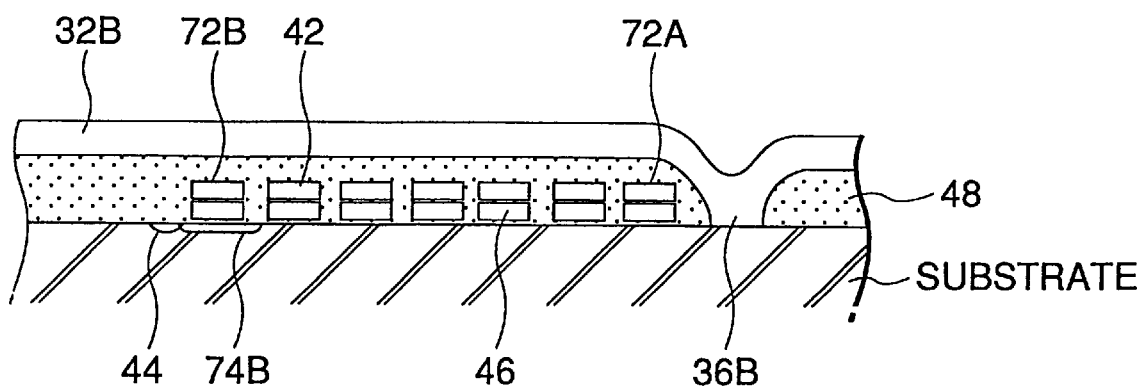
FIG. 5B is a sectional view for indicating a layer structure of the NAND-type flash memory device, taken along a line III—III of FIG. 5A.

A fourth embodiment is accomplished by applying the NANA-type memory device of the second present invention to another NAND-type flash memory device 70. FIG. 5A is a plan view for showing a plane arrangement of bit lines and bit contacts provided in memory cell arrays of the NAND-type flash memory device 70 according to the embodiment 4. FIG. 5B is a sectional view for representing a layer structure of this NAND-type flash memory device 70, taken along a line III—III of FIG. 5A.

In the NAND-type flash memory device 70 according to this embodiment 4, the first memory cell 34A, the bit lines 32A and 32B, the bit contacts 36A and 36B, the control gate 42, the floating gate 46, and the activated region 49 are arranged in the same plane arrangement of the NAND-type flash memory device 30 of the first embodiment.

In this embodiment, a switching transistor 72A is provided in the vicinity of a source region of the first memory cell 34A, namely in the vicinity of the source contact 38A of the first embodiment, instead of the source line 40 and the source contact 38 employed in the embodiment 1. Also, another switching transistor 72B is provided in the vicinity of a source region of the second memory cell (not shown), namely in the vicinity of the source contact 38B of the first embodiment.

The switching transistor 72A performs a selective switching operation in such a manner that the bit line 32A is electrically interrupted from the first memory cell 34A, and thus may function as a source line of the second memory cell.

A depletion type (depletion mode) MOSFET 74 is provided on the connection side of the source region of the switching transistor 72.

Figure 6A:
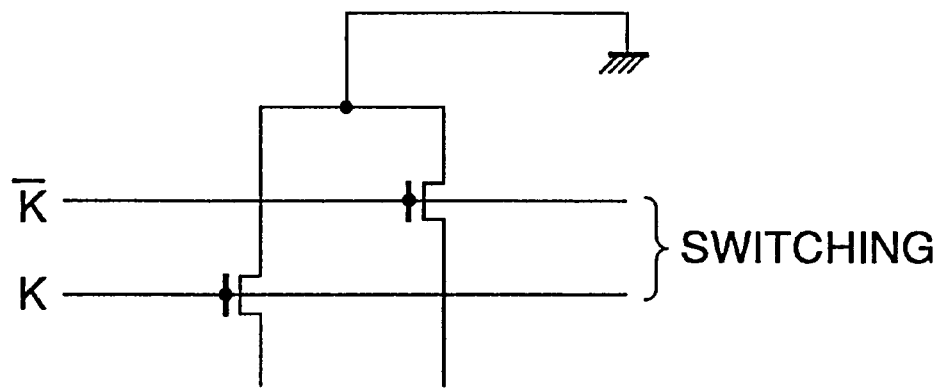
FIG. 6A shows an equivalent circuit diagram of a switching transistor portion of a source line employed in the NAND-type flash memory device of FIG. 5.
Figure 6B:
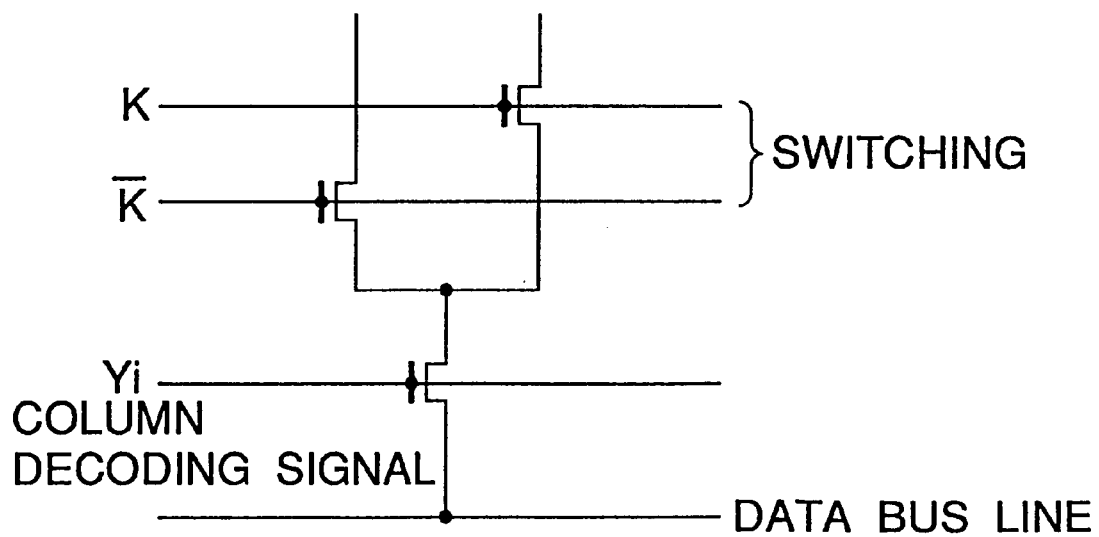
FIG. 6B indicates an equivalent circuit diagram of a switching transistor portion of a bit line employed in the NAND-type flash memory device of FIG. 5.

FIG. 6 is an equivalent circuit diagram of the NAND-type flash memory device 70 according to this embodiment 4. FIG. 6A represents an equivalent circuit diagram of the switching transistor portion for the source line. FIG. 6A shows an equivalent circuit diagram of the switching transistor portion for the bit line. After switching of the source line and the bit line is defined by the above-described arrangement of the switching transistor portions shown in FIG. 6, the bit line is connected via the normal column decoding circuit to the data bus line.

In accordance with this embodiment 4, since the bit line may have the function of the source line, the dedicated wiring line of the source line is not required.

Accordingly, there is another effect that the integration of this memory device along the word line direction can be further increased in addition to the above-described effect of the first embodiment.

What is claimed is:

1. A NAND-type memory device with NAND-type memory cells having a plurality of memory transistors connected in series and arranged in a matrix form, which comprises:

a memory cell array in which each of said NAND-type memory cells are connected via bit contacts to bit lines wired in an array form; and a plane arrangement of the memory cells, the bit lines, and the bit contacts within the memory cell array, wherein a bit contact of a bit line of a first memory cell, and also a bit contact of a bit line of a second memory cell located adjacent to said first memory cell along a word line direction are mutually arranged along a diagonal direction, sandwiching both said first and second memory cells.

2. A NAND-type memory device as claimed in claim 1 wherein, a source line connected to a source region of each of said first and second memory cells owns a layer structure formed between a control gate and the bit line.

3. A NAND-type memory device with NAND-type memory cells having a plurality of memory transistors connected in series and arranged in a matrix form, which comprises:

a memory cell array in which each of said NAND-type memory cells are connected via bit contacts to bit lines wired in an array form;

a plane arrangement of the memory cells, the bit lines, and the bit contacts within the memory cell array, wherein a bit contact of a bit line of a first memory cell, and also a bit contact of a bit line of a second memory cell located adjacent to said first memory cell along a word line direction are mutually arranged along a diagonal direction, sandwiching both said first and second memory cells; and a switching transistor, provided between the bit contact of the bit line of said first memory cell and the source region of said second memory cell, and selectively switches the bit line of said first memory cell in such a manner that said bit line of the first memory cell is electrically disconnected from said first memory cell and then functions as a source line of the second memory cell.

4. A NAND-type memory device as claimed in claim 3 wherein, a depletion mode MOSFET is provided on a connection side of a source region of said switching transistor.

* * * * *